(12) United States Patent
Yamada et al.

(10) Patent No.: US 7,863,803 B2
(45) Date of Patent: Jan. 4, 2011

(54) TUNING FORK RESONATOR ELEMENT AND TUNING FORK RESONATOR

(75) Inventors: Yoshiyuki Yamada, Minami-Minowa (JP); Hideo Tanaya, Suwa (JP)

(73) Assignee: Epson Toyocom Corporation (JP)

( * ) Notice: Subject to any disclaimer, the term of this patent is extended or adjusted under 35 U.S.C. 154(b) by 241 days.

(21) Appl. No.: 12/128,905

(22) Filed: May 29, 2008

(65) Prior Publication Data

US 2008/0297008 A1  Dec. 4, 2008

(30) Foreign Application Priority Data

May 30, 2007 (JP) ............................. 2007-143001
May 30, 2007 (JP) ............................. 2007-143002

(51) Int. Cl.
*H03H 9/21* (2006.01)
(52) U.S. Cl. .................. 310/370; 310/371; 333/200
(58) Field of Classification Search .............. 310/370, 310/371; 333/200; *H03H 9/215, 9/21*
See application file for complete search history.

(56) References Cited

U.S. PATENT DOCUMENTS

| 5,719,460 | A  | * | 2/1998  | Watarai et al. ......... 310/316.01 |
| 7,352,117 | B2 |   | 4/2008  | Kawanishi et al. |
| 2005/0285483 | A1 | * | 12/2005 | Satoh et al. .................. 310/370 |
| 2006/0082261 | A1 | * | 4/2006  | Tanaya ........................ 310/370 |
| 2006/0186768 | A1 | * | 8/2006  | Kawanishi et al. .......... 310/370 |
| 2007/0024163 | A1 | * | 2/2007  | Tanaya ........................ 310/370 |
| 2007/0040470 | A1 | * | 2/2007  | Watanabe .............. 310/316.01 |

FOREIGN PATENT DOCUMENTS

| JP | 54-151391 | 11/1979 |
| JP | 60-070812 | 4/1985 |
| JP | 09-238041 | 9/1997 |
| JP | 2001-156584 | 6/2001 |
| JP | 2004-072609 | 3/2004 |
| JP | 2004-200917 | 7/2004 |
| JP | 2004-260593 | 9/2004 |
| JP | 2004-297344 | 10/2004 |
| JP | 2004-297580 | 10/2004 |
| JP | 2005-109741 | 4/2005 |
| JP | 2006-246449 | 9/2006 |
| JP | 2006-311088 | 11/2006 |
| JP | 2006-339729 | 12/2006 |
| JP | 2007-096900 | 4/2007 |

* cited by examiner

*Primary Examiner*—Thomas M Dougherty
*Assistant Examiner*—Bryan P Gordon
(74) *Attorney, Agent, or Firm*—Harness, Dickey & Pierce, P.L.C.

(57) ABSTRACT

A tuning fork resonator element that has a base portion, first and second resonating arms extending from the base portion in a first direction, and a support frame sandwiching the first and second resonating arms and being connected to the base portion includes: a first excitation electrode, formed in an area close to a connection portion with the base portion of the support frame, being connected to a mount electrode with a conductive adhesive; a second excitation electrode, formed in at least one of an area sandwiching the first and second resonating arms of the support frame and an area positioned farther than the first and second resonating arms in the first direction, being connected to a mount electrode with the conductive adhesive; and a cut portion of the support frame formed on an external surface of the support frame.

10 Claims, 7 Drawing Sheets

TUNING FORK RESONATOR ELEMENT AND TUNING FORK RESONATOR

BACKGROUND OF THE INVENTION

1. Technical Field

The present invention relates to a tuning fork resonator element and a tuning fork resonator using a piezoelectric material.

2. Related Art

A tuning fork resonator element is manufactured by forming a tuning fork type shape from a piezoelectric substrate and an electrode on the front surface, utilizing a photolithography technique.

In particular, formation methods of electrodes and support methods for tuning fork resonator elements have recently been studied for the purposes of improvements in performance and productivity of thinner and miniaturized tuning fork resonator elements.

A first example of related art, JP-A-2006-339729, describes that in order to improve the accuracy of light exposure for a crotch portion of a tuning fork, a mask is brought into contact with a resist formed on an electrode formation surface of a tuning fork resonator element and a light source is inclined at a predetermined angle so that light applied to an inclined surface of a crotch portion formed between resonating arms is made closer to the direction of applying the light perpendicularly to the inclined surface, thus performing light exposure.

Also, a mount structure where a support arm is joined to and supported with a base is disclosed.

In a second example of related art, JP-A-2001-156584, it is disclosed that side end surfaces of a piezoelectric element chip are formed to be outwardly convex such that inclined surfaces having slopes of 5 to 20 degrees with respect to a direction perpendicular to the upper surface or the lower surface intersect with each other in the center portion in the thickness direction from the upper surface and the lower surface.

It is also disclosed that in forming a resist for forming electrodes for this purpose, applying ultraviolet light from right above or at an angle of 0 to 30 degrees enables the resist on the side end surfaces to be exposed to light with reliability.

Thus, it is disclosed that electrodes can be accurately formed in side end surfaces, particularly in the crotch portion.

This eliminates a short-circuit between electrodes, thus preventing defective products.

It is also disclosed that the amount of polishing is controlled by jetting a solid-gas two-phase jetting flow from a jetting opening of a nozzle to cause side end surfaces of a piezoelectric element chip to be inclined.

A third example of related art, JP-A-54-151391, describes that the size of an etching residue in the crotch portion of a tuning fork is relevant to the space and thickness of the resonating arm.

A fourth example of related art, JP-A-2006-311088, discloses that two supporting arms are each joined to two points of electrode portions of a substrate through a conductive adhesive.

In the first related art example, as shown in FIG. 9, a tuning fork resonator element has a structure in which two support arms 91 are provided at positions sandwiching two resonating arms 11 and the support arms 91 are each mounted on a base through a conductive adhesive 92.

With such a structure, a portion that is likely to function as a leakage path is the crotch portion of the resonating arm.

Therefore, as disclosed in the third related art example, an etching residue in the crotch portion of a resonating arm is formed using the space and thickness of the resonating arm, allowing a resist of the crotch portion to be exposed to light if the exposure is perpendicular to the substrate to prevent a short-circuit between electrodes.

Alternatively, an etching residue in the crotch portion of a resonating arm is formed by the adjustment of conditions such as etchant concentration and etching time, allowing a short-circuit between electrodes of the crotch portion to be prevented.

However, with a structure of the first related art example, if an impact is applied from the outside, leading ends of the resonating arms 11 and leading ends of a base portion are dramatically displaced up and down with a mount portion serving as a fulcrum as shown in a side view in FIG. 10.

Therefore, a clearance between a resonator element and a package as well as a clearance between a resonator element and a lid need to be large.

In the structure of the first related art example, however, if an impact from the outside is applied, the leading end of the resonating arm 11 and the leading end of the base portion are largely displaced with the mount portion serving as the fulcrum, as shown in the side view of FIG. 10.

Therefore, a clearance between the resonator element and the package and a clearance between the resonator element and the lid need to be large.

If a structure of fixing a resonator element by using a conductive adhesive at two points of each support arm as in the fourth related art example is employed, it is difficult to provide a card-type tuning fork resonator needed to have a thickness of 0.4 mm or less so as to ensure a clearance between the resonator element and the package and a clearance between the resonator element and the lid.

The use of the inclined light exposure disclosed in the first related art example and a method of jetting a solid-gas two-phase jetting flow disclosed in the second related art example degrades the throughput to increase the manufacturing cost as well as productivity.

SUMMARY

The present invention can be achieved by the following.

A tuning fork resonator element according to a first aspect of the invention has a base portion, first and second resonating arms extending from the base portion in a first direction, and a support frame sandwiching the first and second resonating arms and being connected to the base portion.

The tuning fork resonator element includes a first excitation electrode, which is connected to a mount electrode with a conductive adhesive, formed in an area close to a connection portion with the base portion of the support frame, a second excitation electrode, which is connected to a mount electrode with the conductive adhesive, formed in at least one of an area sandwiching the first and second resonating arms of the support frame and an area positioned farther than the first and second resonating arms in the first direction, and a cut portion of the support frame formed on an external surface of the support frame.

With such a structure, due to the cut portion of the base portion, electrode films left on the side surfaces of the support frame and the base portion can prevent the first excitation electrode and the second excitation electrode from generating a short circuit.

The cut portion of the support frame can be formed in a process of forming the outline of the tuning fork resonator element, and therefore electrode films left on the side surfaces of the support frame and the base portion can prevent a short circuit between the first excitation electrode and the second excitation electrode without increasing the number of processes.

In the tuning fork resonator element according to the first aspect of the invention, the first and second excitation electrodes may each have electrode films on a front surface and a back surface of the support frame and an electrode film on a side surface of the support frame for connecting the electrode films on the front surface and the back surface.

The electrode film on the side surface of the support frame may be cut in the cut portion of the support frame.

In the tuning fork resonator element according to the first aspect of the invention, it is preferable that a cut portion of the base portion be formed on both sides in a width direction of the base portion, the first and second excitation electrodes each extend through electrode films on a front surface and a back surface of the base portion to the resonating arm, and the electrode films on the front surface and the back surface of the base portion be connected through an electrode film of a side surface of the base portion and the electrode film on the side surface of the base portion be cut in the cut portion of the base portion.

In the tuning fork resonator element according to the first aspect of the invention, it is preferable that a cut portion of the base portion be formed on both sides in a width direction of the base portion, the first and second excitation electrodes each extend through electrode films on a front surface and a back surface of the base portion to the resonating arm, and the electrode films on the front surface and the back surface of the base portion be connected through an electrode film of a side surface of the base portion and the electrode film on the side surface of the base portion be cut in the cut portion of the base portion.

In the tuning fork resonator element according to the first aspect of the invention, it is preferable that a fin made by anisotropic etching be formed in the cut portion of the base portion.

In the tuning fork resonator element according to the first aspect of the invention, it is preferable that a substrate of the tuning fork resonator element be formed of quartz crystal including crystal axes having an X axis, a Y axis and a Z axis, the first direction be a direction closest to a direction of the Y axis among the crystal axes, and the width direction be a direction closest to a ±X axis direction among the crystal axes and a fin on a +X axis side be longer than a fin on a −X axis side.

In the tuning fork resonator element according to the first aspect of the invention, it is preferable that a space between the first and second resonating arms be longer than a width of the cut portion of the base portion.

In the tuning fork resonator element according to the first aspect of the invention, it is preferable that a groove, a groove electrode formed in the groove and a side surface electrode be formed in each of the first and second resonating arms, and each of the groove have a tie bar formed therein.

A tuning fork resonator according to a second aspect of the invention includes: a tuning fork resonator element; a base having the mount electrode formed thereon and having a seal hole; a package frame closing part of the seal hole and being layered on the base; a sealing member for sealing the seal hole; and a lid for sealing the package frame. The tuning fork resonator element includes: a base portion; first and second resonating arms extending from the base portion in a first direction; a support frame sandwiching the first and second resonating arms and being connected to the base portion, a first excitation electrode formed in an area close to a connection portion with the base portion of the support frame, the first excitation electrode being connected to a mount electrode with a conductive adhesive; a second excitation electrode formed in at least one of an area sandwiching the first and second resonating arms of the support frame and an area positioned farther than the first and second resonating arms in the first direction, the second excitation electrode being connected to a mount electrode with the conductive adhesive; and a cut portion of the support frame formed on an external surface of the support frame.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the invention will be described below with reference to the accompanying drawings.

Embodiment

Figure 1:
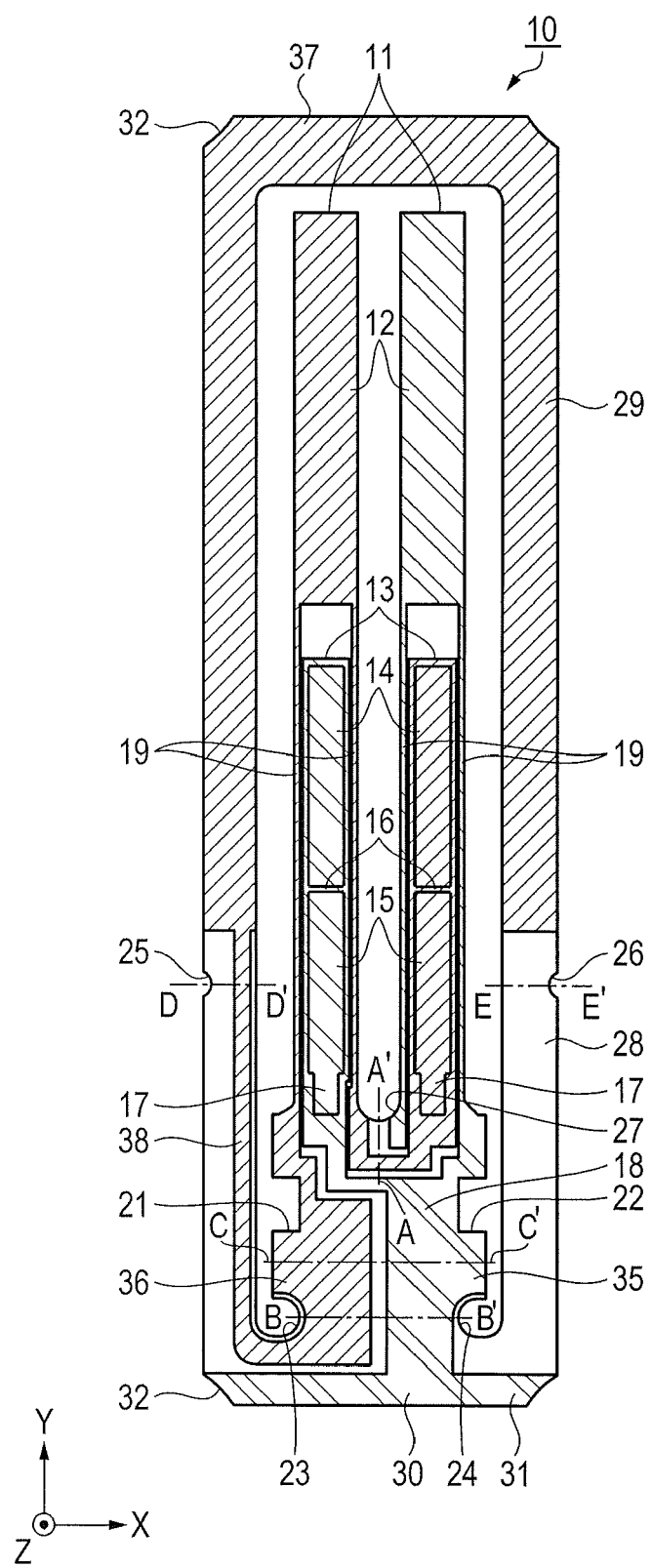
FIG. 1 is a top view showing a tuning fork resonator element according to an embodiment.

FIG. 1 is a top view showing a tuning fork resonator element according to the present embodiment.

Figure 2:
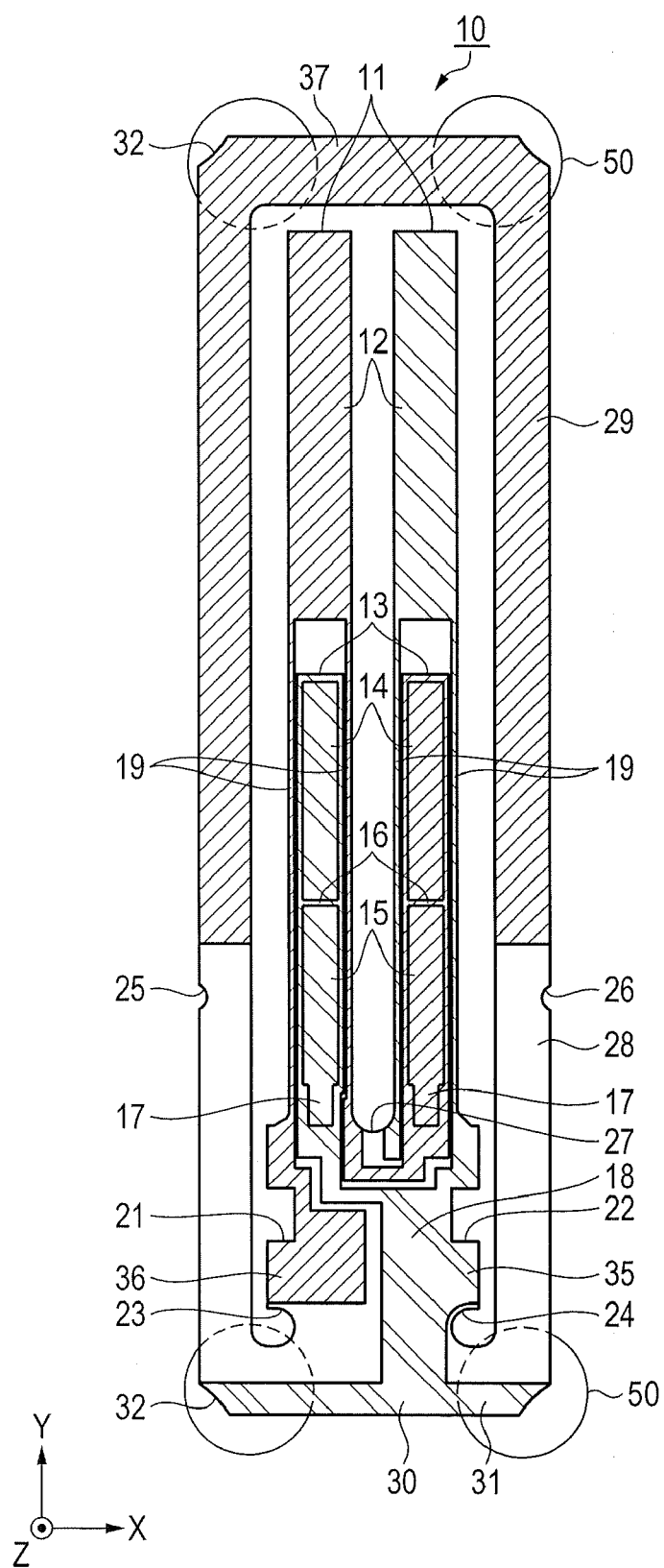
FIG. 2 is a bottom view showing the tuning fork resonator element according to the embodiment.

FIG. 2 is a bottom view showing the tuning fork resonator element according to the embodiment.

The bottom view used herein shows the bottom surface seen from the top, and the bottom surface actually seen from the bottom is reversed from right to left.

The lid side of a package in which a tuning fork resonator element is housed is the top surface (front surface) and the base side of the package is the bottom surface (back surface).

Note that in FIGS. 1 and 2, a tuning fork resonator element 10 formed from a quartz crystal substrate that is cut from quartz crystal with the Z axis used as the normal is taken as an example.

However, the tuning fork resonator element 10 only have to be a piezoelectric material having a crystal orientation.

For example, lithium tantalite and lithium niobate may be used.

Structure of Tuning Fork Resonator Element

The tuning fork resonator element 10 includes a base portion 18, first and second resonating arms 11 extending in the Y axis direction from the base portion 18, and a support frame 28 connected in the −Y axis direction from the base portion 18 and is formed of a single crystal plate of single quartz crystal.

Structure of Resonating Arm

The leading end portion of the resonating arm 11 is provided with a weight portion 12 that is made of a metal film and that controls the frequency by controlling the mass.

The resonating arm 11 is provided with side surface electrodes 19 from the front surface to the side surfaces and is provided with grooves 14 and 15 on the top surface and the bottom surface and electrode films formed so as to cover the grooves 14 and 15, that is, groove electrodes 13.

The resonating arms 11 are excited such that when one vibrates in the +X axis direction, the other vibrates in the −X axis direction.

Part of the weight portion 12 on the bottom surface is removed by laser exposure during frequency control and then is adhered to the base.

The weight adhered to the base may come into contact with the resonating arms 11 to block flexural vibrations of the resonating arms 11.

Therefore, an extra clearance between the weight adhered to the base and the resonating arm 11 needs to be provided.

To address this issue, it is possible to further reduce the thickness of the package with a structure of providing the weight portion 12 only on the top surface, not on the bottom surface.

To enhance the excitation efficiency, the grooves 14 and 15 are provided on the top surface and the bottom surface of the resonating arm 11, and electrode films, that is, the groove electrodes 13 are provided so as to cover the grooves 14 and 15.

However, a vibration component perpendicular to a quartz crystal resonator element substrate (hereinafter, referred to as a "perpendicular vibration component") becomes large due to the external shape of the tuning fork resonator element 10, the anisotropy of etching processes of making grooves, and the pattern displacement between the top surface and the bottom surface of the tuning fork resonator element 10.

This tendency becomes more remarkable when the width of the resonating arm 11 is decreased as the tuning fork resonator is miniaturized, causing manufacture variations of the tuning fork resonator element 10.

In particular, wide manufacturing variations in peak temperature of temperature-frequency characteristics, Δf/f (frequency variation) of characteristics of drive level (DL), and ΔCI (crystal impedance (CI) value variation) have been found.

To suppress the manufacturing variations, a tie bar 16 is provided between the grooves 14 and 15 of the resonating arm 11.

The action of the tie bar 16 can enhance the rigidity of the resonating arm 11 in an area with the grooves 14 and 15 to realize stable vibrations, allowing the reduction of manufacturing variations.

To improve the resistance to impact from the outside, the tie bar 16 can use a structure in which impact tends to be transmitted to the resonating arm 11, e.g., a frame supporting structure.

As the countermeasure against the manufacturing variations, the groove 15 is further provided with a reduced width portion 17.

Structure of Base Portion

The base portion 18 has the width greater than the total width of the resonating arms 11 and the connection portion and has reduced width portions 21 and 22.

The reduced width portions 21 and 22 has the effect of making it difficult for the vibration energy of the resonating arms 11 to be transmitted to the support frame 28, so-called an energy-trapping effect, to reduce the CI value.

The reduced width portions 21 and 22 have the effect of making it difficult for the impact from the outside to be transmitted to the resonating arms 11.

The base portion 18 is connected with the support frame 28, and the connection portion or the base portion 18 itself has first cut portions (cut portions of the base portion) 23 and 24.

Formed on the top surface and bottom surface of the base portion 18 are electrode films 35 in which a first excitation electrode 31 to be described later extends to the resonating arms 11.

The electrode films 35 on the top surface and bottom surface of the base portion 18 are connected with a side surface of the base portion 18.

Figure 8:
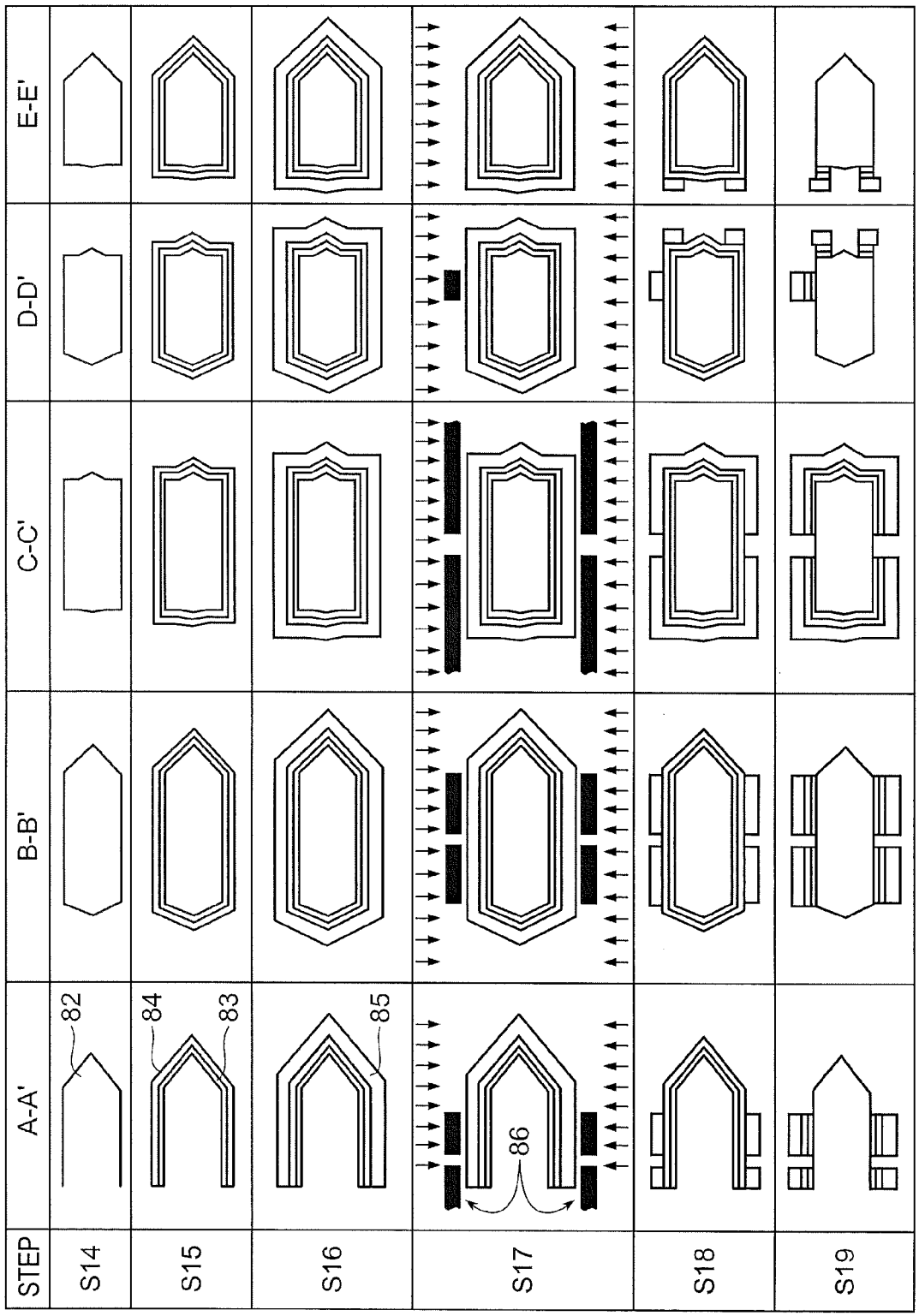
FIG. 8 is an explanatory view schematically showing a sectional shape of a tuning fork resonator element according to the embodiment in each process.
Figure 9:
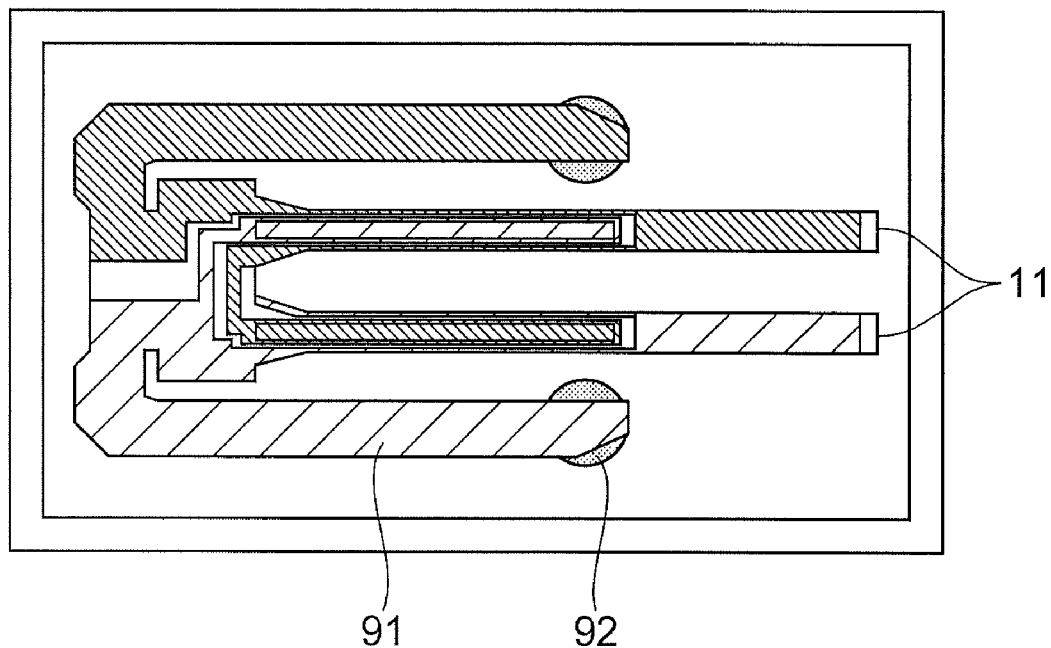
FIG. 9 is a top view showing a tuning fork resonator of related art.
Figure 10:
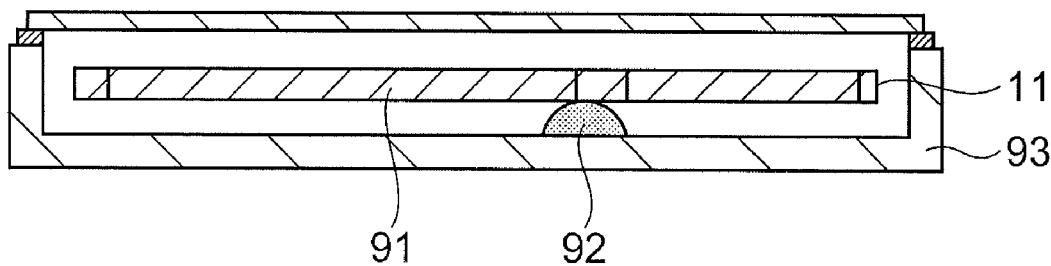
FIG. 10 is a side view showing the tuning fork resonator of related art.

Step S19 of C-C' in FIG. 8 shows section C-C' of FIG. 1 after electrode Au Cr etching.

A first electrode film (Cr film, and the same is true hereinafter) 83 and a second electrode film (Au film, and the same is true hereinafter) 84 are left without being etched and connect the top surface and the bottom surface.

On the other hand, the first cut portions 23 and 24 of the base portion 18 have patterns in which the electrode films 35 are cut on the side surfaces.

Accordingly, the electrode films 35 on the top surface and bottom surface of the base portion 18 are cut.

Step S19 of B-B' in FIG. 8 shows section B-B' of FIG. 1 after the electrode Au Cr etching.

The first electrode film 83 and the second electrode film 84 are cut on the side surfaces, so that the top surface is separated from the bottom surface.

The widths of the first cut portions 23 and 24 of the base portion 18 are formed to be narrower than the space between the resonating arms 11.

Structure of Support Frame

In the connection portion on the −Y axis side of the base portion 18, the support frame 28 and the base portion 18 are connected.

Formed in an area close to the connection portion, that is, a support short side 30 is a first excitation electrode 31, which is electrically and mechanically connected to a mount electrode 51 provided in a base 55 with a conductive adhesive 50 interposed therebetween.

The conductive adhesive 50 may be applied to the mount electrode 51 at two points of the first excitation electrode 31 or along the support short side 30.

This makes it easy for the tuning fork resonator element 10 to be supported in parallel to the base 55.

Regarding the support frame 28, formed in two areas sandwiching the resonating arms 11 or at a position apart from the leading edges of the resonating arms 11 in the Y axis direction is a second excitation electrode 29, which is electrically and mechanically connected to the mount electrode 51 provided in the base 55 with the conductive adhesive 50 interposed therebetween.

The conductive adhesive 50 may be applied to the mount electrode 51 at two points of the second excitation electrode 29 or along a circular connection portion 37 with which two portions of the support frame 28 extending in the Y axis direction on the outsides of the resonating arms 11 are circularly connected in their leading ends.

This makes it easy for the tuning fork resonator element 10 to be supported in parallel to the base 55. In the support frame 28, second cut portions (cut portions of the support frame) 25 and 26 are formed.

The widths of the second cut portions 25 and 26 of the base portion 18 are formed to be narrower than the space between the resonating arms 11.

Step S19 of D-D' in FIG. 8 shows section D-D' of FIG. 1 after the electrode Au Cr etching.

The first electrode film 83 and the second electrode film 84 are left on the top surface so as to form a connect electrode 38 while being removed on the side surfaces and the bottom surface by etching.

No electrode film is provided on the bottom surface.

Similarly, step S19 of E-E' in FIG. 8 shows section E-E' of FIG. 1 after the electrode Au Cr etching.

The first electrode film 83 and the second electrode film 84 are removed on the top surface, bottom surface and side surface on the +X side by etching.

The first electrode film 83 and the second electrode film 84 are left on the side surface on the −X side.

In addition, if the thickness of the package is made thinner, the base 55 for mounting the support frame 28 is made thinner and high rigidity of the support frame 28 is needed so as to cover the rigidity of the base 55.

In this case, the cut portions 25 and 26 are made closer to the support short side 30.

Alternatively, the connect electrode 38 extends in the Y axis direction, and the cut portions 25 and 26 are provided in an area close to the leading end on the +Y side of the connect electrode 38.

Further, to make a countermeasure against short-circuit defects more effective, the second cut portions 25 and 26 may be provided in two portions, a portion close to the support short side 30 and a portion close to the leading end on the +Y side of the connect electrode 38.

Alternating Voltage

Figure 3:
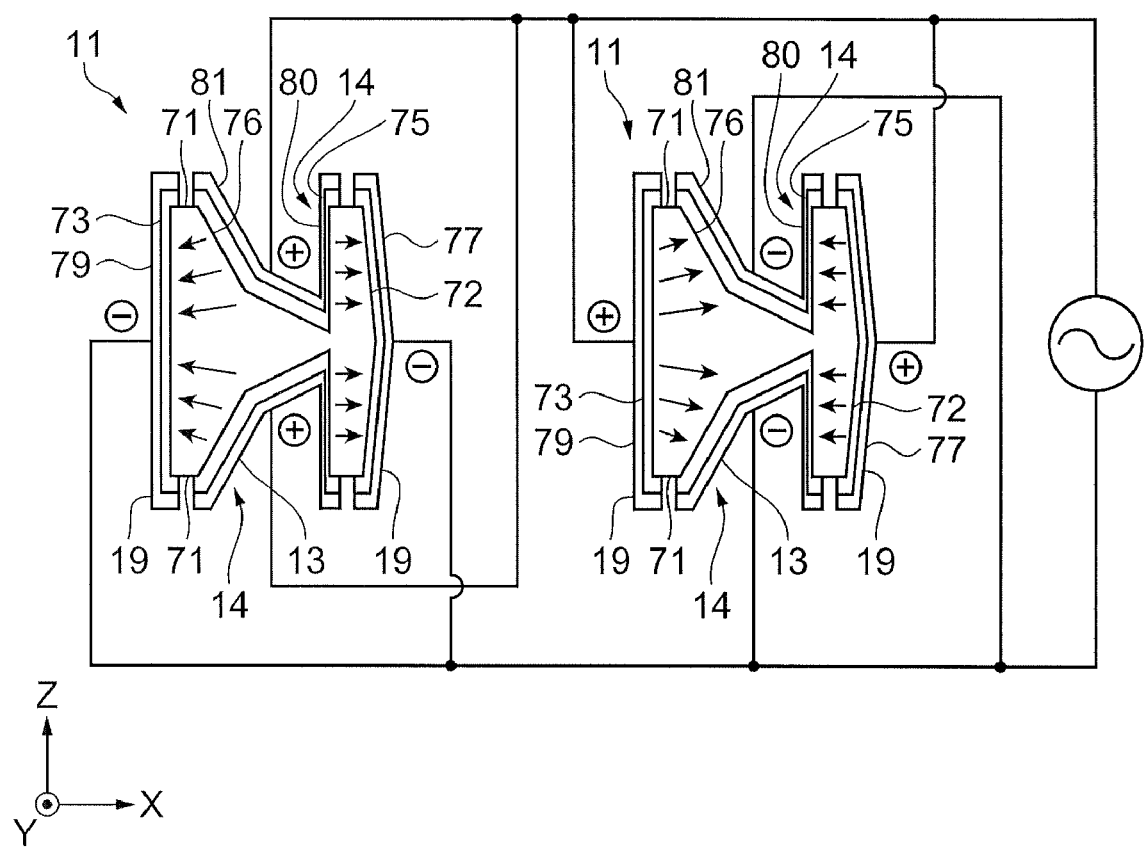
FIG. 3 is a sectional view of areas having grooves formed therein of resonating arms of the tuning fork resonator element according to the embodiment.

FIG. 3 is a sectional view of an area having the grooves 14 or 15 formed therein of the resonating arms 11 of the tuning fork resonator element 10 shown in FIGS. 1 and 2.

The resonating arms 11 has the top and bottom surfaces (front and back surfaces) 71 facing opposite to each other, and first and second side surfaces 72 and 73 connecting the top and bottom surfaces 71 on their both sides.

In the case where the tuning fork resonator element 10 is made of quartz crystal, regarding the crystal orientation, the front and back surfaces 71 have an orientation in the Z axis direction, the first side surface 72 has an orientation in the +X axis direction, and the second side surface 73 has an orientation in the −X axis direction.

The first side surface 72 of one resonating arm 11 (on the left side in FIGS. 1 and 2) and the second side surface 73 of the other resonating arm 11 (on the right side in FIGS. 1 and 2) are arranged in parallel facing each other.

The first side surface 72 is formed into a mountain shape in which the thickness of the resonating arm 11 increases in directions toward the center.

The thickness of the resonating arms 11 is defined by the space between the top and bottom surfaces 71.

An excitation electrode film is formed on the resonating arm 11.

The excitation electrode film may have a multilayer structure including a Cr film serving as an underlying film having a thickness of 10 nm or more and 30 nm or less and an Au film having a thickness of 20 nm or more and 50 or less formed on the Cr film.

The Cr film has high adhesion to quartz crystal and the Au film is resistant to oxidizing because of its low electric resistance.

The excitation electrode film includes first and second side surface electrode films 77 and 79 formed on the first and second side surfaces 72 and 73, respectively, and first and second inner surface electrode films 46 and 48 formed on the first and second inner surfaces 75 and 76, respectively.

The excitation electrode film constitutes the groove electrode 13 and the side surface electrode 19.

Groove electrodes 13 and the side surface electrode 19 are connected to an alternating-current power supply by crosswiring to apply alternating voltage as drive voltage so that the groove electrode 13 of one resonating arm 11 (left side in FIGS. 1 and 2) and the side surface electrode 19 of the other resonating arm 14 (right side in FIGS. 1 and 2) have the same potential (+potential in the example in FIG. 3) while the side surface electrode 19 of one resonating arm 11 and the groove electrode 13 of the other resonating arm 11 have the same potential (−potential in the example in FIG. 3).

The applied voltage generates electric fields as shown by the arrows in FIG. 3, which excite the resonating arms 11 such that they vibrate in opposite phases to each other (such that the leading end sides of the resonating arms 11 move close to and apart from each other), thus generating flexural vibrations.

The alternating voltage is controlled so that the resonating arms 11 vibrate in the fundamental mode.

Separation of First Excitation Electrode from Second Excitation Electrode

As shown in FIG. 2, the first excitation electrode 31 of the support frame 28 is electrically and mechanically connected to the mount electrode 51 formed on the base 55 through the conductive adhesive 50 on the bottom surface of the tuning fork resonator element 10.

The electrode film is formed on the top surface as well as the bottom surface of the support frame 28 using a mask pattern to cause a resist on the side surface of corner portions 32 and on the side surface on the −Y axis side to be left.

As a result, the first excitation electrode 31 on the top surface in FIG. 1 is connected with the first excitation electrode 31 on the bottom surface in FIG. 2 through the electrode film on the side surface of the support frame 28, a voltage applied to the mount electrode 51 has the same potential as those of the first excitation electrodes 31 on the top and bottom surfaces.

Further, the first excitation electrode 31 on the top surface is connected to the groove electrode 13 of one resonating arm 11 (on the left side in FIG. 1) and the side surface electrode 19 of the other resonating arm 11 (on the right side in FIG. 1) through the first electrode film 35 on the top surface.

On the other hand, as shown in FIG. 2, the second excitation electrode 29 of the support frame 28 is electrically and mechanically connected to the mount electrode 51 formed on the base 55 through the conductive adhesive 50 on the bottom surface of the tuning fork resonator element 10.

The electrode film is formed on the top surface as well as the bottom surface of the support frame 28 using a mask pattern to cause a resist on the side surface of corner portions 32, on the side surface on the ±X axis side and on the side surface on the +Y axis side to be left.

As a result, the second excitation electrode 29 on the top surface in FIG. 1 is connected with the second excitation electrode 29 on the bottom surface in FIG. 2 through the electrode film on the side surface of the support frame 28, a voltage applied to the mount electrode 51 has the same potential as those of the second excitation electrodes 29 on the top and bottom surfaces.

Further, the second excitation electrode 29 on the top surface is connected to the connect electrode 38 through the electrode film on the side surface of the support frame 28 and then is connected to the second electrode film of the base portion 18 to be connected to the side surface electrode 19 of one resonating arms 11 (on the left side in FIG. 1) and to the groove electrode of the other resonating arm 11 (on the right side in FIG. 1).

The outline is formed such that the contours of the corner portions 32 are made using a mask pattern having predetermined sides and curved lines.

In this way, a taper of the section can be controlled by angles of the side surface in the case of anisotropy etching of a quartz crystal material.

As a result, a redundant structure having less disconnections on the top and bottom surfaces can be achieved.

Further, the top and bottom surfaces are suitably connected through the electrode film not only on the side surfaces of the corner portions 32 but also on the inner and outer side surfaces of the support frame 28 and on the side surface of the base portion 18, thus achieving the redundant structure having less disconnections on the top and bottom surfaces.

Here, in the case of a structure without the first cut portion 24, the first electrode films 35 of the base portion 18 and the second excitation electrode 29 of the support frame 28 have generated short circuits on the inner side surfaces of the base portion 18 and the support frame 28 in some cases.

This is because if the taper of the section of quartz crystal is approximately perpendicular, a resist is not sufficiently exposed to light in the light exposure process for the side surface electrode to be left.

To address this issue, the first cut portion 24 is provided in the present embodiment.

The circulation of an etchant is poor in the first cut portion 24, and therefore the etching rate in the vertical direction can be reduced in the outline etching of quartz crystal.

As a result, a section having a large etching residue, that is, a section having a long fin can be formed.

The section having a long fin ensures that a resist formed on the fin will be exposed to light, enabling short-circuit defects caused by the residue of the side surface electrode film to be suppressed.

In the case of a structure without the second cut portion 26, the first excitation electrode 31 of the base portion 18 and the second excitation electrode 29 of the support frame 28 have generated short circuits on the outer side surfaces on the +X axis side of the support frame 28 in some cases.

This is also because the taper of the section of quartz crystal is approximately perpendicular and a resist is not sufficiently exposed to light, so that the side surface electrode is left.

To address this issue, the second cut portion 26 is provided in the embodiment.

The second cut portion 26 can have a section having a long fin as the first cut portion 24 does.

As a result, short-circuit defects caused by the residue of the side surface electrode film can be suppressed.

Similarly, the second cut portion 25 suppresses a short-circuit generated on the outer side surface on the −X axis side of the support frame 28 by the first excitation electrode 31 and the second excitation electrode 29.

The first cut portion 23 may be used for suppression of short-circuit defects between excitation electrodes as the first cut portion 24 and second cut portions 25 and 26 do.

However, as shown by hatching in FIGS. 1 and 2, the periphery of the first cut portion 23 has the same potential as that of the second excitation electrode. In other words, suppression of short-circuit defects is not necessary.

In the embodiment, the first cut portion 23 functions as a balancer to balance the right and left of the first cut portion 24.

It is possible to change patterns between the right and left to use the first cut portion 23 for suppression of short-circuit defects and the first cut portion 24 as a balancer. However, the effect of suppressing short-circuit defects is small.

As the sectional view taken along the line B-B' in step S19 in FIG. 8 shows a section along the line B-B', the left side (−X axis side) of the section is more perpendicular and has a shorter fin than the right side (+X axis side) of the section.

As a result, the resist may be not sufficiently exposed to light to cause the residue of the film.

Package Structure

Figure 4:
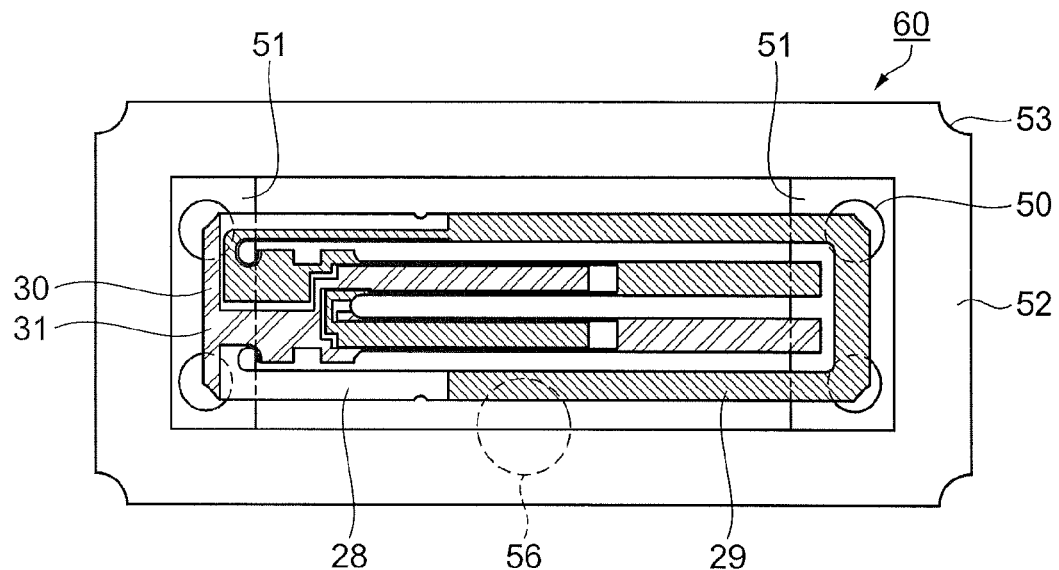
FIG. 4 is a top view showing a tuning fork resonator in which the tuning fork resonator element according to the embodiment is housed.
Figure 5:
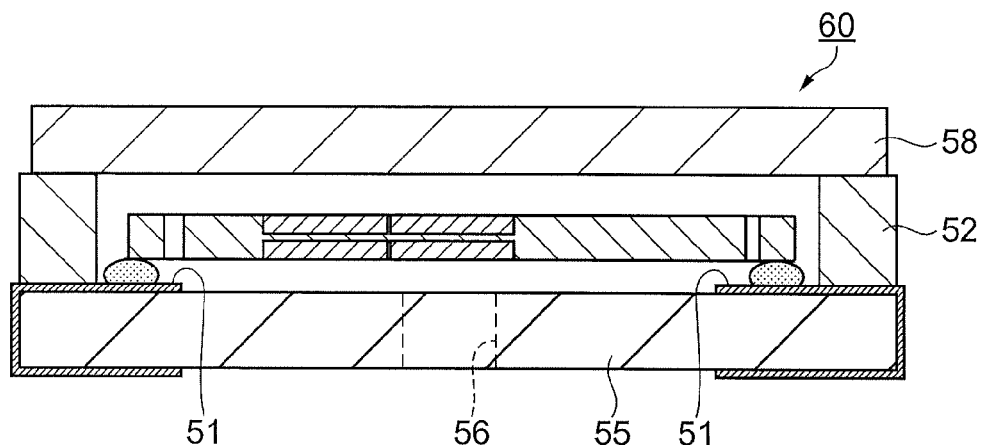
FIG. 5 is a side view showing the tuning fork resonator in which the tuning fork resonator element according to the embodiment is housed.
Figure 6:
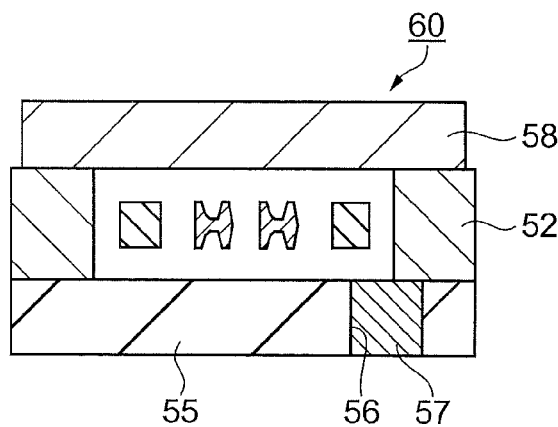
FIG. 6 is a front view showing the tuning fork resonator in which the tuning fork resonator element according to the embodiment is housed.

FIG. 4 is a top view showing the tuning fork resonator 60 in which the tuning fork resonator element 10 according to the embodiment is housed, FIG. 5 is a side view showing the tuning fork resonator 60, and FIG. 6 is a front view showing the tuning fork resonator 60.

Formed on the top surface of the base 55 made of ceramics are the mount electrodes 51.

The conductive adhesive 50 is applied onto the electrodes 51, and the first excitation electrode 31 and the second excitation electrode 29 of the tuning fork resonator element 10 are electrically and mechanically connected to the conductive adhesive 50.

The mount electrodes 51 pass on the side surface of the base 55 and is exposed on the base bottom surface to be connected to an oscillation circuit (not shown).

A seal hole 56 is further formed in the base 55.

Regarding the base 55, metalizing (not shown) is applied the inside diameter of the seal hole to enhance the adhesion with a sealing material 57 to be described later.

A package frame 52 for housing the tuning fork resonator element 10 is layered on the base 55 so as to close part of the seal hole 56.

Further, a lid 58 is sealed so as to close the top surface opening of the package frame 52.

The lid may be sealed by using a metal brazing material and may also be sealed by seam sealing.

To ensure the sealing properties, an intermediate layer may be provided between the package frame 52 and the lid 58.

After the lid 58 and the package frame 52 are sealed, the tuning fork resonator 60 is turned upside down, and then the sealing material 57 (e.g., a metal ball made of an AuGe alloy) is inserted into the seal hole 56 and heated in the vacuum to seal the seal hole 56.

Thus, the tuning fork resonator element 10 is vacuum-housed.

Note that it is found that this method provides a resonator having a low CI value as compared to the case of performing a lid sealing process in vacuum without the use of the seal hole 56.

It is considered that this is because gas generated in the lid sealing process decreases the degree of vacuum inside the package decreases.

Manufacturing Process of Tuning Fork Resonator Element

Figure 7:
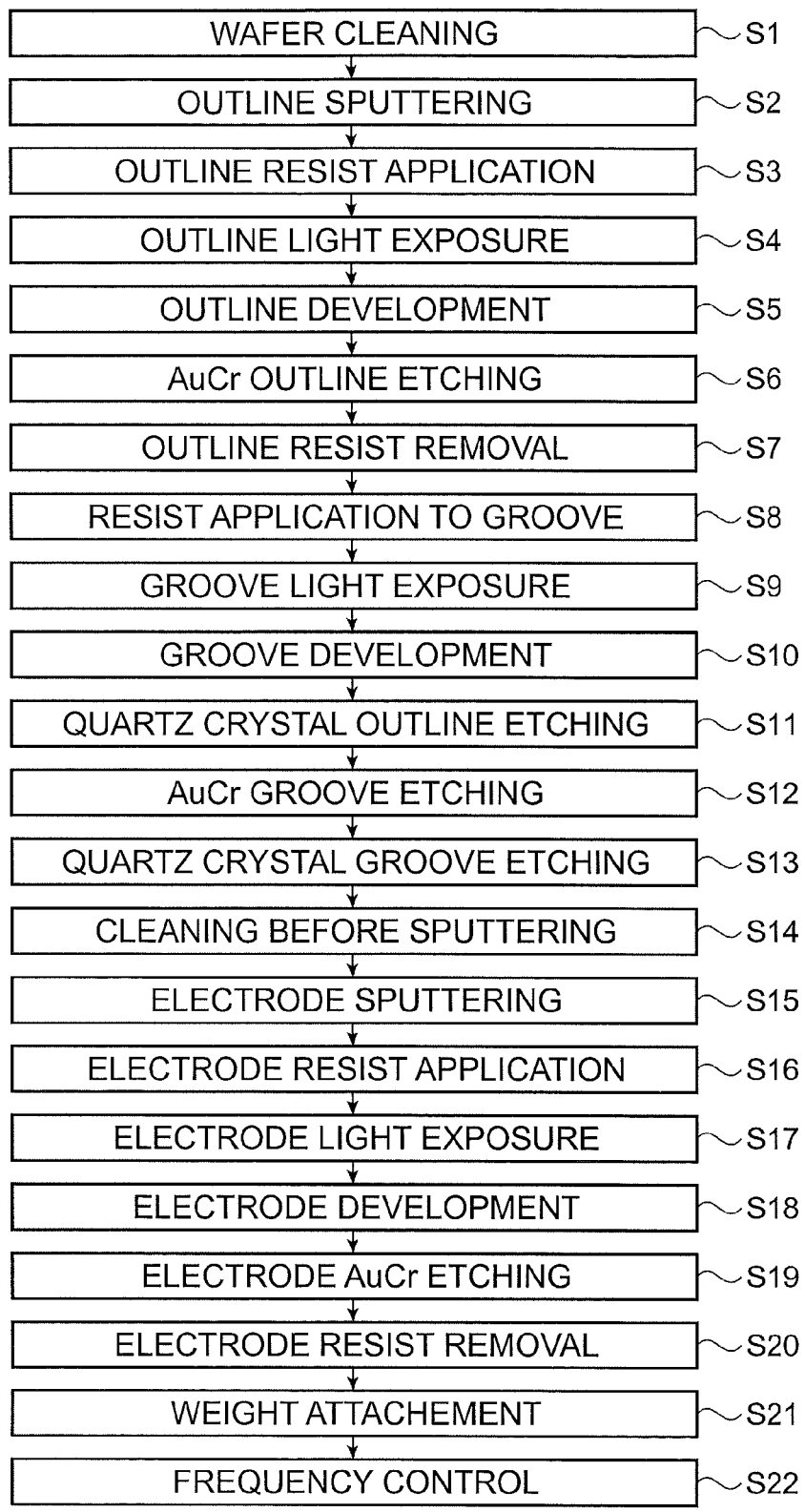
FIG. 7 is a flow chart showing a process flow of the tuning fork resonator element according to the embodiment.

FIG. 7 is a flow chart showing a process flow of the tuning fork resonator element 10 according to the embodiment.

A wafer cut using the Z axis as the normal is cleaned (step S1) and sputtered in the order of Cr and Au (step S2).

Next, a resist is applied (step S3) and exposed to light (step S4) and developed (step S5) along the outline pattern, and Au and Cr formed in films in step S2 are etched (step S6).

Next, the resist applied in step S3 is removed (step S7) and a resist is applied again (step S8).

The resist applied in step S8 is exposed to light (step S9) and developed (step S10) in a pattern of etching a groove.

Next, the outline of quartz crystal is etched using Au and Cr etched in step S6 as a mask (step S11).

Next, Au and Cr are etched in a resist pattern formed by the groove light exposure in step S9 (step S12), and subsequently the groove form of quartz crystal is etched (step S13), and cleaning is performed (step S14).

Next, Au and Cu, which will be electrodes, are sputtered (step S15), and a resist is applied (step S16).

Next, after a resist is applied (step S16), the resist is exposed to light (step S17) and developed (step S18) in a pattern of forming electrodes, and Au and Cr are etched into electrode shapes (step S19).

Next, the resist applied in step S16 is removed (step S20), and a weight is attached (step S21) and the frequency is controlled (step S22) to control the frequency to obtain a desired frequency.

FIG. 8 is a sectional view schematically showing the sectional shape of the tuning fork resonator element formed in the process shown in FIG. 7.

In the figure, reference numeral 82 denotes quartz crystal; 83, Cr; 84, Au; 85, a resist; and 86, a mask pattern.

Steps S14 to S19 in FIG. 8 correspond to states after steps S14 to S19 in FIG. 7.

The A-A' in FIG. 8 corresponds to sections along the line A-A of a crotch portion 27 of the resonating arms 11 of the tuning fork resonator element 10 in FIG. 1 when cut in the Y axis line.

The B-B' in FIG. 8 corresponds to sections along the line B-B' between the first cut portions 23 and 24 in FIG. 1.

The C-C' in FIG. 8 corresponds to sections along the line C-C' in FIG. 1.

The D-D' and E-E' in FIG. 8 correspond to sections along the lines D-D' and E-E' of support arms in FIG. 1 respectively.

In the C-C section of an area without a cut in the base portion 18, the left side (the −X axis side) of the section is approximately perpendicular.

The vicinity of the side surface is masked, and the electrode formed on the side surface connects the top surface with the bottom surface of the first excitation electrode 31 and the top surface with the bottom surface of the second excitation electrode 29.

On the other hand, in the B-B' section in FIG. 8, a long fin is formed on the side surface on the right side (+X axis side).

Further, a mask pattern for exposing the fin to light is used.

As a result, the resist applied to the fin can be exposed to light with reliability, enabling the suppression of a short circuit on the top and bottom surfaces between the first electrode film 35 and the second excitation electrode 29.

The D-D' section and the E-E' section also utilize fins so as to suppress short circuits between the first electrode film 35 (first excitation electrode 31) and the second electrode film 36 (second excitation electrode 29).

In addition, it is found that the side surfaces on the left sides (−X axis sides) of the B-B' section, C-C' section, D-D' section and E-E' section are more perpendicular than the side surfaces on the right sides (+X axis sides) and the crotch portion 27 of the resonating arms 11.

Therefore, to suppress short-circuit defects on the −X axis side, it is preferable the cut width be narrower than the space between the resonating arms 11.

As described above, according to the tuning fork resonator element 10 of the embodiment, due to the first cut portions 23 and 24 of the base portion 18, the electrode film left on the side surfaces of the support frame 28 and the base portion 18 enables the prevention of a short circuit between the first excitation electrode 31 and the second excitation electrode 29.

The first cut portions 23 and 24 can be formed in a process of forming the outline of the tuning fork resonator element 10.

Therefore, the electrode film left on the side surfaces of the support frame 28 and the base portion 18 can prevent a short circuit between the first excitation electrode 31 and the second excitation electrode 29 without increasing the number of processes.

The entire disclosure of Japanese Patent Application Nos: 2007-143001, filed May 30, 2007 and 2007-143002 filed May 30, 2007 are expressly incorporated by reference herein.

What is claimed is:

1. A tuning fork resonator element having a base portion, first and second resonating arms extending from the base portion in a first direction along and substantially parallel to a longitudinal axis of each of the first and second resonating arms, and a support frame sandwiching the first and second resonating arms and being connected to the base portion, the tuning fork resonator element comprising:
   a first excitation electrode formed in an area close to a connection portion with the base portion and the support frame, the first excitation electrode being connected to a mount electrode with a conductive adhesive;
   a second excitation electrode formed in an area sandwiching the first and second resonating arms of the support frame and in an area positioned farther than the first and second resonating arms in the first direction, the second excitation electrode being connected to a mount electrode with the conductive adhesive;
   a pair of cut portions of the support frame formed on side surfaces of the support frame that are opposite to surfaces of the support frame opposing respective ones of the first and second resonating arms, the pair of cut portions being disposed along a length of the support frame between the base portion and a distal end of the support frame;
   a cut portion of the base portion formed on both sides of the base portion in a width direction of the base portion; and
   a fin made by anisotropic etching is formed in the cut portion of the base portion to disconnect the first excitation electrode and the second excitation electrode;
   wherein the first and second excitation electrodes each extend through electrode films on a front surface and a back surface of the base portion to the resonating arm; and
   wherein the electrode films on the front surface and the back surface of the base portion are connected through an electrode film of a side surface of the base portion, the electrode film on the side surface of the base portion being cut in the cut portion of the base portion.

2. The tuning fork resonator element according to claim 1, wherein:
   a substrate of the tuning fork resonator element is formed of quartz crystal including crystal axes having an X axis, a Y axis and a Z axis;
   the first direction is a direction closest to a direction of the Y axis among the crystal axes; and the width direction is a direction closest to a ±X axis direction among the crystal axes and a fin on a +X axis side is longer than a fin on a −X axis side.

3. The tuning fork resonator element according to claim 1, wherein a space between the first and second resonating arms is longer than a width of the cut portion of the base portion.

4. The tuning fork resonator element according to claim 1, wherein:
a groove, a groove electrode formed in the groove and a side surface electrode are formed in each of the first and second resonating arms.

5. A tuning fork resonator, comprising:
a tuning fork resonator element having a base portion, first and second resonating arms extending from the base portion in a first direction along and substantially parallel to a longitudinal axis of each of the first and second resonating arms, and a support frame sandwiching the first and second resonating arms and being connected to the base portion, the tuning fork resonator element including:
a first excitation electrode formed in an area close to a connection portion with the base portion and the support frame, the first excitation electrode being connected to a mount electrode with a conductive adhesive;
a second excitation electrode formed in an area sandwiching the first and second resonating arms of the support frame and in an area positioned farther than the first and second resonating arms in the first direction, the second excitation electrode being connected to a mount electrode with the conductive adhesive; and
a pair of cut portions of the support frame formed on side surfaces of the support frame that are opposite to surfaces of the support frame opposing respective ones of the first and second resonating arms, the pair of cut portions being disposed along a length of the support frame between the base portion and a distal end of the support frame;
a cut portion of the base portion formed on both sides of the base portion in a width direction of the base portion;
a fin made by anisotropic etching is formed in the cut portion of the base portion to disconnect the first excitation electrode and the second excitation electrode;
a base having the mount electrode formed thereon and having a seal hole;
a package frame closing part of the seal hole and being layered on the base;
a sealing member for sealing the seal hole; and
a lid for sealing the package frame;
wherein the first and second excitation electrodes each extend through electrode films on a front surface and a back surface of the base portion to the resonating arm; and
wherein the electrode films on the front surface and the back surface of the base portion are connected through an electrode film of a side surface of the base portion, the electrode film on the side surface of the base portion being cut in the cut portion of the base portion.

6. The tuning fork resonator according to claim 5, wherein:
a substrate of the tuning fork resonator is formed of quartz crystal including crystal axes having an X axis, a Y axis and a Z axis;
the first direction is a direction closest to a direction of the Y axis among the crystal axes;
the width direction is a direction closest to a ±X axis direction among the crystal axes and a fin on a +X axis side is longer than a fin on a −X axis side.

7. The tuning fork resonator according to claim 5, wherein a space between the first and second resonating arms is longer than a width of the cut portion of the base portion.

8. The tuning fork resonator according to claim 5, wherein:
a groove, a groove electrode formed in the groove and a side surface electrode are formed in the first and second resonating arms.

9. The tuning fork resonator element according to claim 1, wherein the width direction of the base is substantially perpendicular to the longitudinal axis of the first and second resonating arms.

10. The tuning fork resonator element according to claim 5, wherein the width direction of the base is substantially perpendicular to the longitudinal axis of the first and second resonating arms.

* * * * *